(12) United States Patent
Sasaki et al.

(10) Patent No.: US 8,198,179 B2
(45) Date of Patent: Jun. 12, 2012

(54) METHOD FOR PRODUCING GROUP III NITRIDE SEMICONDUCTOR LIGHT-EMITTING DEVICE

(75) Inventors: Yasumasa Sasaki, Kamakura (JP); Hisayuki Miki, Chiba (JP)

(73) Assignee: Showa Denko K.K., Tokyo (JP)

( * ) Notice: Subject to any disclaimer, the term of this patent is extended or adjusted under 35 U.S.C. 154(b) by 492 days.

(21) Appl. No.: 12/439,937

(22) PCT Filed: Feb. 7, 2008

(86) PCT No.: PCT/JP2008/052023
§ 371 (c)(1), (2), (4) Date: Mar. 4, 2009

(87) PCT Pub. No.: WO2008/102646
PCT Pub. Date: Aug. 28, 2008

(65) Prior Publication Data
US 2011/0001163 A1 Jan. 6, 2011

(30) Foreign Application Priority Data
Feb. 21, 2007 (JP) .................................. 2007-040691

(51) Int. Cl.
*H01L 33/32* (2010.01)
(52) U.S. Cl. ... 438/485; 438/483; 438/798; 204/192.12; 204/192.25
(58) Field of Classification Search .................. 438/485
See application file for complete search history.

(56) References Cited

U.S. PATENT DOCUMENTS

| | | | |
|---|---|---|---|
| 5,122,845 A | 6/1992 | Manabe et al. | |
| 5,290,393 A | 3/1994 | Nakamura | |
| 5,571,748 A | 11/1996 | Miyazawa et al. | |
| 5,650,361 A * | 7/1997 | Radhakrishnan | 438/779 |
| 5,811,319 A * | 9/1998 | Koike et al. | 438/46 |
| 6,165,812 A | 12/2000 | Ishibashi et al. | |
| 6,452,214 B2 | 9/2002 | Kaneyama et al. | |
| 6,475,923 B1 * | 11/2002 | Mitamura | 438/758 |
| 6,541,797 B1 | 4/2003 | Udagawa | |

(Continued)

FOREIGN PATENT DOCUMENTS

GB 2 309 582 A 7/1997

(Continued)

OTHER PUBLICATIONS

Y. Ushiku, et al., 21st century joint symposium of Science technology and human, 2003, pp. 295-298, vol. 2.

(Continued)

*Primary Examiner* — Nathan W. Ha
*Assistant Examiner* — Abul Kalam
(74) *Attorney, Agent, or Firm* — Sughrue Mion, PLLC

(57) ABSTRACT

A method for producing a group III nitride semiconductor light-emitting device including: an intermediate layer formation step in which an intermediate layer containing group III nitride is formed on a substrate by sputtering, and a laminate semiconductor formation step in which an n-type semiconductor layer having a base layer, a light-emitting layer, and a p-type semiconductor layer are laminated on the intermediate layer in this order, wherein the method includes a pretreatment step in which the intermediate layer is treated using plasma between the intermediate layer formation step and the laminate semiconductor formation step, and a formation step for the base layer which is included in the laminate semiconductor formation step is a step for laminating the base layer by sputtering.

24 Claims, 5 Drawing Sheets

U.S. PATENT DOCUMENTS

| | | | |
|---|---|---|---|
| 6,686,608 B1 | 2/2004 | Takahira | |
| 6,713,789 B1 | 3/2004 | Shibata et al. | |
| 6,861,663 B2 | 3/2005 | Sawazaki et al. | |
| 7,023,026 B2 | 4/2006 | Yamamoto | |
| 7,851,824 B2 * | 12/2010 | Sawada et al. | 257/190 |
| 2005/0122828 A1 * | 6/2005 | Odagawa et al. | 365/232 |

FOREIGN PATENT DOCUMENTS

| | | |
|---|---|---|
| JP | 60-039819 A | 3/1985 |
| JP | 04-297023 A | 10/1992 |
| JP | 05-086646 B2 | 12/1993 |
| JP | 05-347456 A | 12/1993 |
| JP | 08-264478 A | 10/1996 |
| JP | 09-036427 A | 2/1997 |
| JP | 09-205254 A | 8/1997 |
| JP | 09-260289 A | 10/1997 |
| JP | 11-243056 A | 9/1999 |
| JP | 11-274535 A | 10/1999 |
| JP | 11-354846 A | 12/1999 |
| JP | 3026087 B2 | 1/2000 |
| JP | 2001-035805 A | 2/2001 |
| JP | 2001-094150 A | 4/2001 |
| JP | 2003-048799 A | 2/2003 |
| JP | 3440873 B2 | 6/2003 |
| JP | 2003-347580 A | 12/2003 |
| JP | 2004-179457 A | 6/2004 |
| JP | 3700492 B2 | 7/2005 |
| JP | 2005-244202 A | 9/2005 |
| JP | 2006-036561 A | 2/2006 |
| JP | 2006-080426 A | 3/2006 |
| TW | 523940 | 3/2003 |
| TW | 200607113 | 2/2006 |
| WO | 2005/071720 A1 | 8/2005 |
| WO | 2006101856 A2 | 9/2006 |

OTHER PUBLICATIONS

T. Kikuma, et al., "GaN films deposited by planar magnetron sputtering," Vacuum, 2002, pp. 233-237, vol. 66.

Office Action dated Mar. 7, 2012 for corresponding Taiwanese Patent Application No. 097105419.

Office Action dated Apr. 17, 2012 for corresponding Japanese Patent Application No. 2008-145898.

* cited by examiner

METHOD FOR PRODUCING GROUP III NITRIDE SEMICONDUCTOR LIGHT-EMITTING DEVICE

TECHNICAL FIELD

The present invention relates to a method for producing a group III nitride semiconductor light-emitting device which are suitably used in light-emitting diodes (LEDs), laser diodes (LDs), or electronic devices; a group III nitride semiconductor light-emitting device; and a lamp.

Priority is claimed on Japanese Patent Application, No. 2007-040691, filed on Feb. 21, 2007, the contents of which are incorporated herein by reference in their entirety.

BACKGROUND ART

Since a group III nitride semiconductor light-emitting device has a direct transition-type energy band gap which corresponds in a range from the visible wavelength to the ultraviolet wavelength, and has excellent light-emitting efficiency, it has been used as a light-emitting device, such as LEDs or LDs.

In addition, an electronic device having a group III nitride semiconductor has superior properties to those of conventional electronic devices having a group III-V compound semiconductor.

Such a group III-V compound semiconductor is generally produced by growing a group III-V compound semiconductor crystal on a single crystal wafer containing a different compound from the semiconductor crystal. There is a large lattice mismatch between the single crystal wafer containing a different compound from the semiconductor crystal and the group III-V compound semiconductor crystal obtained by epitaxial growth. For example, when gallium nitride (GaN) is grown on a sapphire ($Al_2O_3$) substrate, there is a 16% of lattice mismatch between them. When gallium nitride is grown on a SiC substrate, there is a 6% lattice mismatch between them.

In general, when there is a large lattice mismatch, it is difficult to epitaxially grow crystal on a substrate directly. Even when crystal is epitaxially grown on the substrate, the density of the crystal is decreased, together with a decrease of crystallinity.

Then, a layer, which is called a buffer layer, is generally formed between the substrate and the group III-V compound semiconductor crystal to minimize the lattice mismatch between them. For example, Patent documents Nos. 1 and 2 suggest a method in which when group III nitride semiconductor crystal is epitaxially grown on a sapphire single crystal substrate or a SiC single crystal substrate by a metalorganic chemical vapor deposition (MOCVD) method, a low temperature buffer layer containing aluminum nitride (AlN) or gallium aluminum nitride (AlGaN) is epitaxially grown on the substrate at 400 to 600° C. in advance, and then group III nitride semiconductor crystal is epitaxially grown on the low temperature buffer layer at high temperatures, for example, about 1000° C.

In addition, a technique for forming the buffer layer by a method other than MOCVD is also suggested. Specifically, a method is suggested in which a buffer layer is formed by sputtering using high frequency, and a crystal layer having the same composition as that of the buffer layer is formed by MOCVD method (Patent Document No. 3). However, the density and crystallinity of the crystal formed on the buffer layer are decreased. It is impossible to stably laminate an excellent crystal layer.

Then, Patent Document No. 4 discloses a method in which after growing a buffer layer, the buffer layer is annealed in a mixed gas containing ammonia and hydrogen to constantly obtain an excellent crystal layer.

In addition, Patent Document No. 5 discloses a method in which a buffer layer having a thickness of 50 to 3,000 angstroms is produced by a DC sputtering method at 400° C. or more, and the obtained buffer layer is annealed in a mixed gas containing ammonia and hydrogen.

Patent Documents Nos. 4 and 5 disclose sapphire, silicon, carbonized silicon, zinc oxide, gallium phosphide, gallium arsenide, magnesium oxide, manganese oxide, a group III nitride semiconductor single crystal, etc. as a material used for a substrate. They also disclose that an a-plane of a sapphire substrate is the most suitable as the substrate.

However, when the buffer layer is annealed under severe conditions with a very high reducing ability, such as in the mixed gas containing ammonia and hydrogen, damage of the buffer layer is increased. As a result, the density of the crystal layer on the buffer layer is not sufficiently improved. In addition, damage of not only the buffer layer but also the substrate is also serious.

Research for producing group III nitride semiconductor crystal by sputtering method has also been also carried out. For example, Patent Document No. 6 discloses that a GaN film is directly formed on a sapphire substrate by the sputtering method in order to laminate a GaN film having high resistance. The lamination conditions are such that the ultimate vacuum is $5 \times 10^{-7}$ Torr to $5 \times 10^{-8}$ Torr, the flowing gas in a chamber is Ar and $N_2$, the gas pressure for sputtering is $3 \times 10^{-2}$ Torr to $5 \times 10^{-2}$ Torr, the RF voltage is 0.7 kV to 0.9 kV (corresponding to 20 to 40 W in power), the distance between a substrate and a target is 20 mm to 50 mm, and the substrate temperature is 150° C. to 450° C.

However, the compound semiconductor disclosed in Patent Document No. 6 is used for MIS elements, and not used for LEDs having a buffer layer, an n-type group III nitride semiconductor crystal layer, a light-emitting layer, and a p-type group III nitride semiconductor crystal layer which are laminated on a sapphire substrate in this order.

In addition, the following Non-Patent Document No. 1 reports that a GaN film is laminated on the (100) plane of Si and the (0001) plane of $Al_2O_3$ (0001) by high frequency magnetron sputtering using $N_2$ gas. The lamination conditions are that the total gas pressure is 2 mTorr, the supplied power is 100 W, and the substrate temperature is changed from room temperature to 900° C. According to the figure of Non-Patent Document No. 1, a target and a substrate face each other in the used device.

In the following Non-Patent Document No. 2, a GaN film is formed using a device in which a cathode and a target face each other and a mesh is placed between the substrate and the target. According to Non-Patent Document No. 2, the lamination conditions are such that the pressure is 0.67 Pa, the atmosphere is $N_2$ gas, the substrate temperature is 84° C. to 600° C., the supplied power is 150 W, and the distance between the substrate and the target is 80 mm. However, there is no description about any pretreatments for the buffer layer in Non-Patent Documents Nos. 1 and 2.

The following Patent Document No. 7 discloses a method in which reverse sputtering is carried out using Ar gas as a pretreatment for a semiconductor layer when an electrode is formed on the semiconductor layer.

However, according to Patent Document No. 7, only electrical interengagement properties between the semiconductor layer and the electrode are improved by reverse sputtering the surface of the group III nitride semiconductor layer, and then forming a metal layer by deposition. There is no description about any relationship between a pretreatment for the buffer layer and density of the group III nitride semiconductor layer laminated on the buffer layer in Patent Document No. 7.

[Patent Document No. 1] Japanese Patent (Granted) Publication No. 3026087
[Patent Document No. 2] Japanese Unexamined Patent Application, First Publication No. H4-297023
[Patent Document No. 3] Japanese Examined Patent Application, Second Publication No. H5-86646
[Patent Document No. 4] Japanese Patent (Granted) Publication No. 3440873
[Patent Document No. 5] Japanese Patent (Granted) Publication No. 3700492
[Patent Document No. 6] Japanese Unexamined Patent Application, First Publication No. S60-39819
[Patent Document No. 7] Japanese Unexamined Patent Application, First Publication No. H8-264478
[Non-Patent Document No. 1] The 21st century union symposium collected papers, Vol. 2nd, page 295 (2003)
[Non-Patent Document No. 2] Vacuum, Vol. 66, page 233 (2002)

DISCLOSURE OF THE INVENTION

Problems to be Solved by the Invention

As explained above, a technique has been known in which a buffer layer is formed, the buffer layer is annealed under an ammonia-hydrogen mixed atmosphere, and then a semiconductor layer is formed on the annealed buffer layer. However, since the annealing is performed in an atmosphere having extremely high reducing ability, and damage of the buffer layer and the substrate is substantial, the density of the crystal contained in the semiconductor layer is not as improved as expected.

In addition, when a group III nitride semiconductor is formed by sputtering after formation of a buffer layer, it is necessary to once take the substrate after formation of the buffer layer into the atmosphere. A chamber for sputtering is strictly designed depending on the kind of material for a film. Therefore, in general, different chambers are used to form a layer having a different composition or function.

However, when the buffer layer is exposed to the atmosphere, the outermost surface of the buffer layer may be altered. When a group III nitride semiconductor layer is formed on the altered buffer layer, a damaged layer is generated in the group III nitride semiconductor layer. In addition, many voids (air spaces) may be caused in the semiconductor crystals, and the density may be decreased.

In consideration of the above-described problems, an object of the present invention is to provide a method which can laminate a crystal film having excellent uniformity within a short time on a substrate. Specifically, one object of the present invention is to provide a method for producing a group III nitride semiconductor light-emitting device having excellent productivity, which can grow a group III nitride semiconductor having excellent crystallinity and density on an intermediate layer which functions as a buffer layer, and which can provide a group III nitride semiconductor light-emitting device having excellent light-emitting properties. Another object of the present invention is to provide a group III nitride semiconductor light-emitting device having excellent light-emitting properties. Another object of the present invention is to provide a lamp.

Means for Solving the Problem

As a result of conducting diligent research to solve the problems, the present inventors found that when an intermediate layer is pretreated in an appropriate manner after lamination of the intermediate layer by sputtering, the intermediate layer can be optimized such that the lattice structure thereof is matched to the group III nitride semiconductor, and a stable, excellent group III nitride semiconductor crystal can be obtained. Thereby, the present inventors achieved the present invention.

That is, the present invention relates to the following inventions.

[1] A method for producing a group III nitride semiconductor light-emitting device comprising: an intermediate layer formation step in which an intermediate layer containing group III nitride is formed on a substrate by sputtering, and a laminate semiconductor formation step in which an n-type semiconductor layer having a base layer, a light-emitting layer, and a p-type semiconductor layer are laminated on the intermediate layer in this order, wherein the method includes a pretreatment step in which the intermediate layer is treated using plasma between the intermediate layer formation step and the laminate semiconductor formation step, and a formation step for the base layer which is included in the laminate semiconductor formation step is a step for laminating the base layer by sputtering.

[2] A method for producing a group III nitride semiconductor light-emitting device according to [1], wherein the intermediate layer formation step is carried out in a first chamber, the formation step for the base layer is carried out in a second chamber, and the substrate on which the intermediate layer is formed is taken out from the first chamber between the intermediate formation step and the pretreatment step.

[3] A method for producing a group III nitride semiconductor light-emitting device according to [1] or [2], wherein the pretreatment step is carried out by flowing a pretreatment gas containing at least one selected from the group consisting of nitrogen, argon, and a mixture gas of nitrogen and argon on the surface of the intermediate layer.

[4] A method for producing a group III nitride semiconductor light-emitting device according to [1] or [2], wherein the pretreatment step is carried out by flowing a pretreatment gas containing nitrogen on the surface of the intermediate layer.

[5] A method for producing a group III nitride semiconductor light-emitting device according to [3] or [4], wherein the partial pressure of nitrogen in the pretreatment gas is in a range of from $1 \times 10^{-2}$ Pa to 10 Pa.

[6] A method for producing a group III nitride semiconductor light-emitting device according to any one of [3] to [5], wherein the pressure of the pretreatment gas during the pretreatment step is in a range of from 0.01 Pa to 5 Pa.

[7] A method for producing a group III nitride semiconductor light-emitting device according to any one of [2] to [6], wherein the partial pressure of oxygen remaining in the second chamber is $2.0 \times 10^{-6}$ Pa or less.

[8] A method for producing a group III nitride semiconductor light-emitting device according to any one of [3] to [7], wherein the time for the pretreatment is in a range of from 30 seconds to 7,200 seconds.

[9] A method for producing a group III nitride semiconductor light-emitting device according to any one of [3] to [7], wherein the time for the pretreatment is in a range of from 60 seconds to 1,800 seconds.

[10] A method for producing a group III nitride semiconductor light-emitting device according to any one of [3] to [9], wherein the temperature of the substrate in the pretreatment step is in a range of from 25° C. to 1,000° C.

[11] A method for producing a group III nitride semiconductor light-emitting device according to any one of [3] to [9], wherein the temperature of the substrate in the pretreatment step is in a range of from 400° C. to 900° C.

[12] A method for producing a group III nitride semiconductor light-emitting device according to any one of [1] to [11], wherein the pretreatment step and the formation step for the base layer are carried out in the same chamber.

[13] A method for producing a group III nitride semiconductor light-emitting device according to any one of [1] to [12], wherein the plasma treatment in the pretreatment step is reverse sputtering.

[14] A method for producing a group III nitride semiconductor light-emitting device according to [13], wherein the pretreatment step is a step in which reverse sputtering is carried out by generating plasma using an electrical power supply having high frequency.

[15] A method for producing a group III nitride semiconductor light-emitting device according to [13], wherein the pretreatment step is a step in which reverse sputtering is carried out by generating nitrogen plasma using an electrical power supply having high frequency.

[16] A method for producing a group III nitride semiconductor light-emitting device according to any one of [13] or [15], wherein a bias in a range of from 1 to 200 W is applied to one substrate having a diameter of 50 mm in the pretreatment step.

[17] A method for producing a group III nitride semiconductor light-emitting device according to any one of [1] to [16], wherein the intermediate layer includes columnar crystals.

[18] A method for producing a group III nitride semiconductor light-emitting device according to any one of [1] to [17], wherein the intermediate layer is foamed so as to cover at least 90% of the surface of the substrate.

[19] A method for producing a group III nitride semiconductor light-emitting device according to [17], wherein an average grain width of the columnar crystals in the intermediate layer is in a range of from 1 nm to 100 nm.

[20] A method for producing a group III nitride semiconductor light-emitting device according to [17], wherein an average grain width of the columnar crystals in the intermediate layer is in a range of from 1 nm to 70 nm.

[21] A method for producing a group III nitride semiconductor light-emitting device according to any one of [1] to [20], wherein the thickness of the intermediate layer is in a range of from 10 nm to 500 nm.

[22] A method for producing a group III nitride semiconductor light-emitting device according to any one of [1] to [20], wherein the thickness of the intermediate layer is in a range of from 20 nm to 100 nm.

[23] A method for producing a group III nitride semiconductor light-emitting device according to any one of [1] to [22], wherein the intermediate layer contains Al.

[24] A method for producing a group III nitride semiconductor light-emitting device according to [23], wherein the intermediate layer is made of AlN.

[25] A method for producing a group III nitride semiconductor light-emitting device according to any one of [1] to [23], wherein the base layer is made of GaN-based semiconductor.

[26] A method for producing a group III nitride semiconductor light-emitting device according to [25], wherein the base layer is made of AlGaN.

[27] A group III nitride semiconductor light-emitting device produced by the method according to any one of [1] to [26].

[28] A group III nitride semiconductor light-emitting device, wherein an intermediate layer containing group III nitride, an n-type semiconductor layer having a base layer, a light-emitting layer, and a p-type semiconductor layer are laminated on a substrate, and the surface of the intermediate layer which faces the base layer is subjected to a pretreatment including a plasma treatment.

[29] A group III nitride semiconductor light-emitting device according to [28], wherein the plasma treatment is a treatment in which nitrogen plasma generated by a power supply having high frequency is exposed to the surface of the intermediate layer which faces the base layer.

[30] A lamp including the group III nitride semiconductor light-emitting device according to any one of [27] to [29].

Effects of the Present Invention

According to the method for producing a group III nitride semiconductor light-emitting device and the group III nitride semiconductor light-emitting device of present invention, it is possible to grow a group III nitride semiconductor having excellent crystallinity and density of the crystal on the base layer. Therefore, the method for producing a group III nitride semiconductor light-emitting device has excellent productivity. In addition, it is possible to produce a group III nitride semiconductor light-emitting device having excellent light-emitting properties.

EXPLANATION OF REFERENCE SYMBOLS

| | | | |
|---|---|---|---|
| 1: | light-emitting device (group III nitride semiconductor light-emitting device) | | |
| 2: | lamp | | |
| 10: | laminate semiconductor | 11: | substrate |
| 11a: | surface of the substrate | 12: | intermediate layer |
| 14: | n-type semiconductor layer | 14a: | base layer |
| 15: | light-emitting layer | 16: | p-type semiconductor layer |
| 17: | translucent anode | | |

BEST MODE FOR CARRYING OUT THE INVENTION

Below, embodiments of the group III nitride semiconductor light-emitting device, the production method therefor, and the lamp including the group III nitride semiconductor light-emitting device are explained referring to figures.

Figure 1:
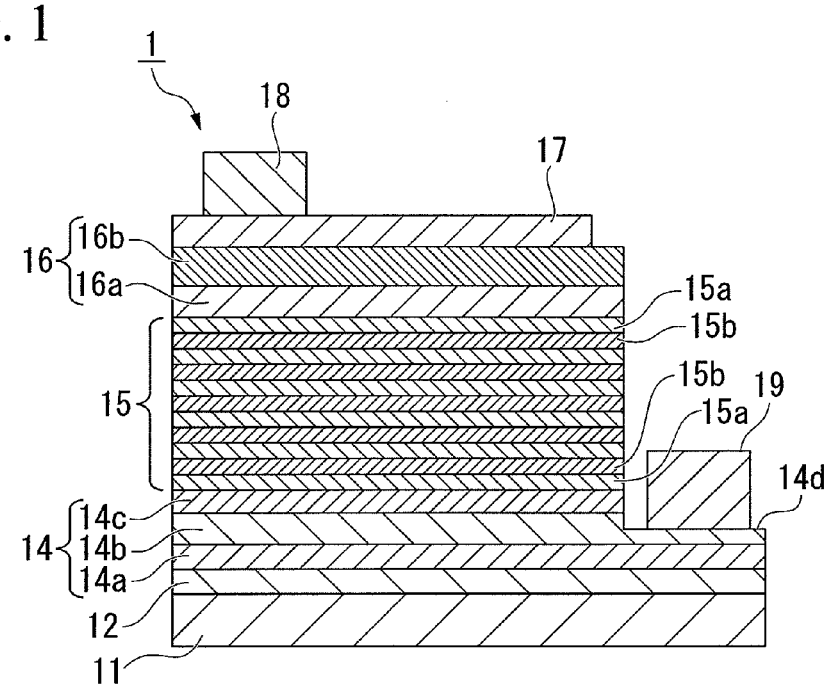
FIG. 1 is a sectional view showing one example of the group III nitride semiconductor light-emitting device according to the present invention.
Figure 2:
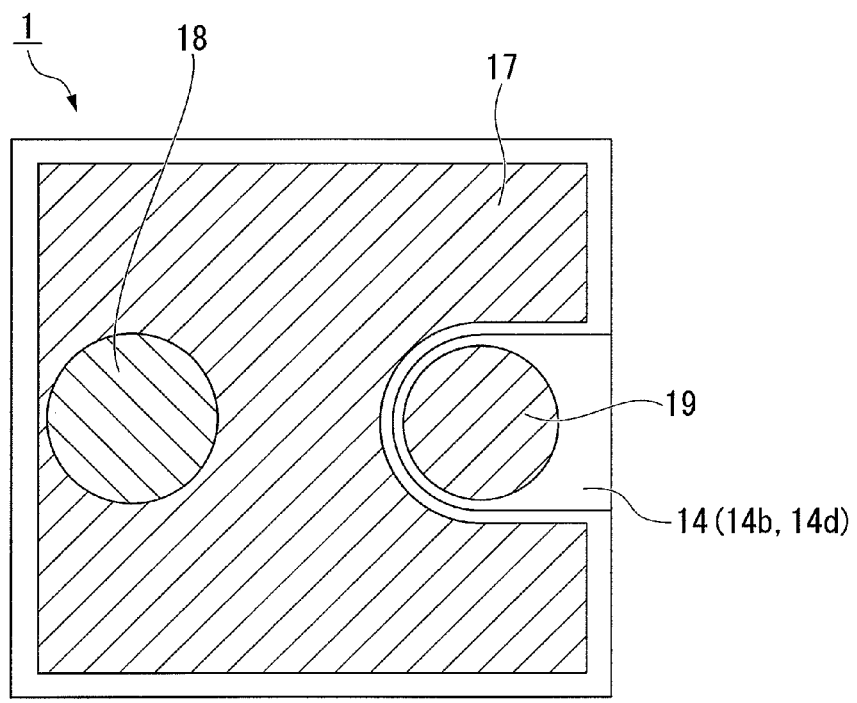
FIG. 2 is a planar view showing one example of the group III nitride semiconductor light-emitting device according to the present invention.
Figure 3:
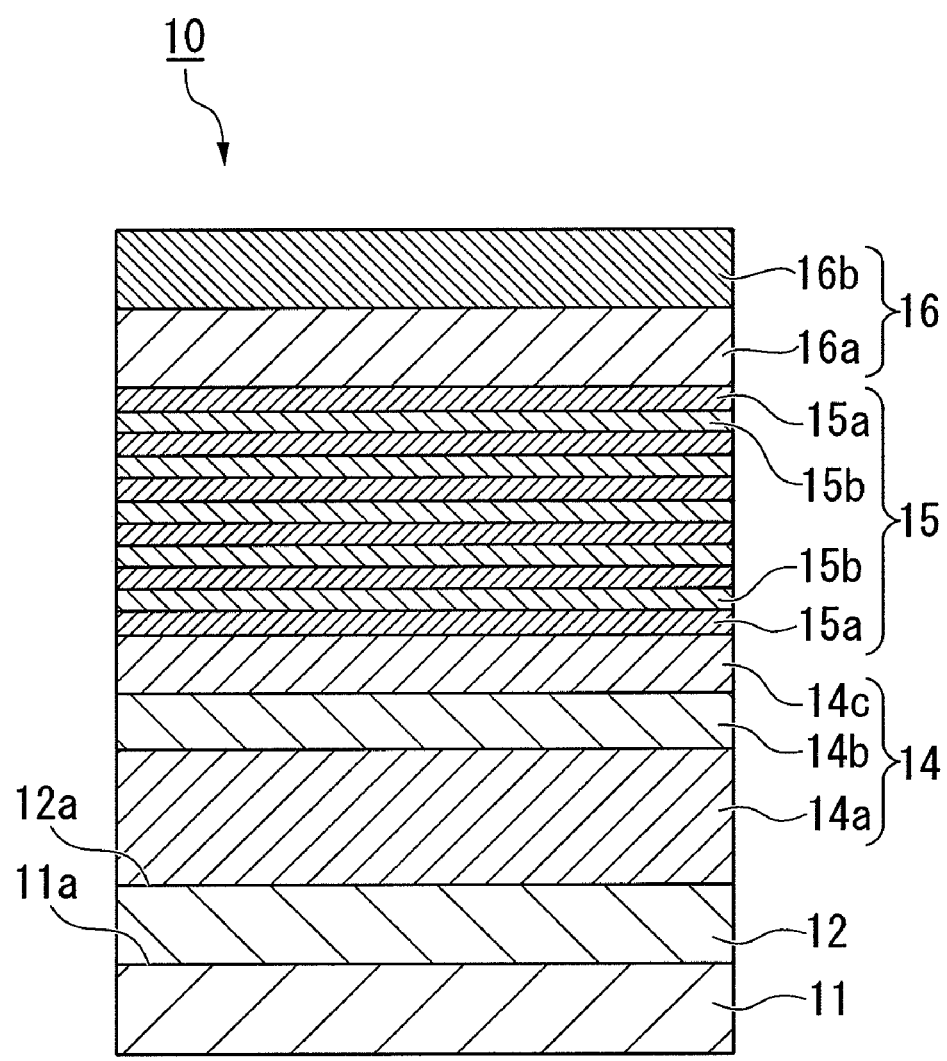
FIG. 3 is a sectional view showing a laminate semiconductor which constitutes the group III nitride semiconductor light-emitting device according to the present invention.
Figure 4:
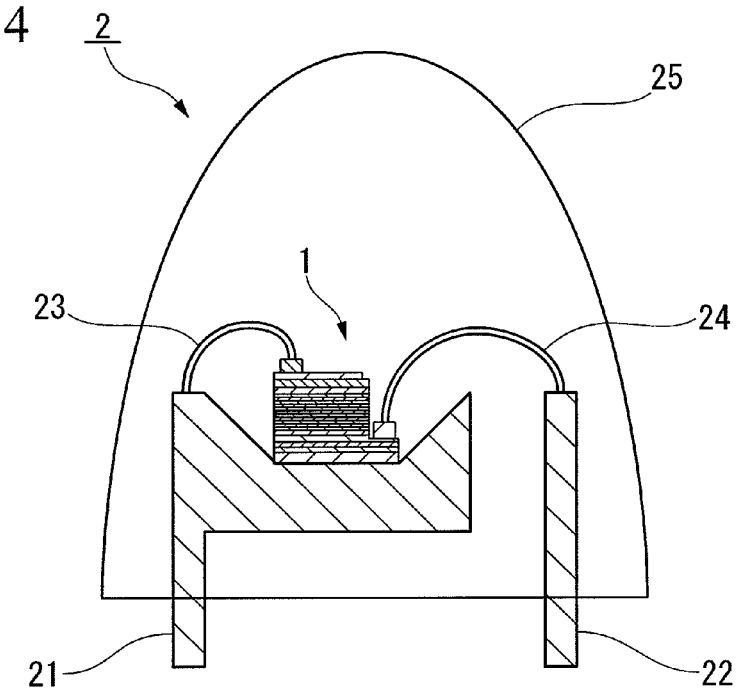
FIG. 4 is a sectional view showing the lamp provided with the group III nitride semiconductor light-emitting device according to the present invention.

FIG. 1 is a sectional view showing a group III nitride semiconductor light-emitting device of this embodiment. FIG. 2 is a planar view showing the group III nitride semiconductor light-emitting device. FIG. 3 is a sectional view showing a laminate semiconductor which constitutes the group III nitride semiconductor light-emitting device. FIG. 4 is a sectional view showing the lamp provided with the group III nitride semiconductor light-emitting device of this embodiment.

Moreover, figures referred to in the following explanations are for explaining the group III nitride semiconductor light-emitting device, the production method therefor, and the lamp. Therefore, size, thickness, etc. of each part illustrated in figures differ from real size, thickness, etc in the actual group III nitride semiconductor light-emitting device.

"Group III Nitride Semiconductor Light-Emitting Device"

In the group III nitride semiconductor light-emitting device of the present invention, an intermediate layer including group III nitride, an n-type semiconductor layer having a base layer, a light-emitting layer, and a p-type semiconductor layer are laminated on a substrate. In addition, the surface of the intermediate layer which faces the base layer is subjected to a pretreatment including a plasma treatment. The plasma treatment is a treatment for exploring the surface of the intermediate layer which faces the base layer with nitrogen plasma generated by an electric power source having high frequency.

Below, the specific structure of the group III nitride semiconductor light-emitting device (abbreviated light-emitting device below) is explained in detail referring to FIGS. 1 to 3.

The light-emitting device 1 includes a substrate 11, an intermediate layer 12 laminated on one surface 11a of the substrate 11, an n-type semiconductor layer 14 laminated on the intermediate layer 12, a light-emitting layer 15 laminated on the n-type semiconductor layer 14, a p-type semiconductor layer 16 laminated on the light-emitting layer 15, a transparent cathode 17 laminated on the p-type semiconductor layer 16, a cathode bonding pad 18 formed on the transparent cathode 17, and an anode bonding pad 19 formed on the n-type semiconductor layer 14.

As shown in FIG. 3, the n-type semiconductor layer 14, the light-emitting layer 15, and the p-type semiconductor layer 16 constitute a laminate semiconductor 10. The n-type semiconductor layer 14 constituting the laminate semiconductor 10 includes a base layer 14a, an n-type contact layer 14b, and an n-type clad layer 14c.

As shown in FIGS. 1 and 2, a part of the n-type contact layer 14b is exposed, and the anode bonding pad 19 is connected to the exposed n-type contact layer 14b. In addition, one surface 12a of the intermediate layer 12 which faces the base layer 14a is subjected to a plasma treatment. The base layer 14 is laminated on the one surface 12a of the intermediate layer 12.

Below, each layer constituting the light-emitting device 1 is explained in detail.

[Substrate 11]

The material forming the substrate 11 on which the group III nitride semiconductor crystal is laminated is not particularly limited, and any material can be used. Examples of the material for the substrate 11 include sapphire, SiC, silicon, zinc oxide, magnesium oxide, manganese oxide, zirconium oxide, manganese-zinc-iron oxide, magnesium-aluminum oxide, zirconium boride, gallium oxide, indium oxide, lithium-gallium oxide, lithium-aluminum oxide, neodium-gallium oxide, lanthanum-strontium-aluminum-tantalum oxide, strontium-titanium oxide, titanium oxide, hafnium, tungsten, molybdenum. Among these, sapphire is especially preferable. Although the c-plane or the a-plane of sapphire may be used as the surface 11a of the substrate 11, the c-plane is preferably used.

[Intermediate Layer 12]

In the light-emitting device of this embodiment, the intermediate layer 12 containing group III nitride is formed on the substrate 11 by sputtering. The intermediate layer 12 can be produced by activating and reacting metal material and gas containing a group V element with plasma.

The intermediate layer 12 preferably covers 60% or more, and more preferably 80% or more of the total area of the surface 11a of the substrate 11. In addition, from the viewpoint of functions as a coating layer for the substrate 11, the intermediate layer preferably covers 90% or more of the surface 11a of the substrate 11. Furthermore, in particular, the intermediate layer 12 preferably covers all of the surface 11a of the substrate 11 without any gaps. When the intermediate layer 12 does not cover the substrate 11, and the surface of the substrate 11 is exposed, a part of the base layer 14a which is laminated on the intermediate layer 12 grows from the surface 11a of the substrate 11. In this case, since the lattice constant of the crystal exposed from the surface 11a of the substrate 11 is largely different from that of the base layer 14a, the base layer 14 does not contain uniform crystals. Due to this, there is a possibility that hillocks or pits are generated. Therefore, this is not preferable.

It is preferable that the intermediate layer 12 be an aggregate of columnar crystals, because such an intermediate layer 12 further minimizes the lattice mismatch between the substrate 11 and the n-type semiconductor layer 14. The group III nitride semiconductor crystal, which constitutes the n-type semiconductor layer 14, has a hexagonal crystal structure, and easily forms a texture based on a hexagonal prism. In particular, the film formed by a film production method using plasmaized metallic material easily has a columnar crystal structure. Therefore, the intermediate layer 12 acts effectively as a buffer layer by laminating the intermediate layer 12 containing columnar crystals on the substrate 11. Thereby, the n-type nitride semiconductor layer 14 containing group III nitride semiconductor crystal formed on the intermediate layer 12 becomes a crystal film with good crystallinity.

In addition, the average grain width of the columnar crystals in the intermediate layer 12 is preferably in a range of from 1 to 100 nm, and more preferably in a range of from 1 to 70 nm, from the viewpoint of functions as the buffer layer. In order to improve crystallinity of the group III nitride semiconductor crystals which constitute an n-type semiconductor layer, it is necessary to control properly the grain width of each columnar crystal in the intermediate layer 12. Specifically, the grain width is preferably in the range of from 1 to 100 nm, as explained above. The grain width of the crystals in the intermediate layer 12 can be easily measured by many methods such as sectional observation by TEM.

It is preferable that the crystal grain have a nearly columnar shape as explained above. The intermediate layer 12 is preferably a layer in which columnar grains are aggregated. When the intermediate layer 12 is an aggregation of columnar grains, the grain width means the distance between the interfaces of the crystals. On the other hand, when grains are dotted like islands, the grain width means the span of the largest portion of the surface of the crystal grain which contacts the surface of the substrate 11.

The thickness of the intermediate layer 12 is preferably in a range of from 10 to 500 nm, and more preferably in a range of from 20 to 100 nm. When the thickness of the intermediate layer 12 is less than 10 nm, the intermediate layer 12 does not sufficiently act as the buffer layer. In contrast, when it exceeds 500 nm, the time for producing the intermediate layer is longer and the productivity is decreased, nevertheless there is no change of the functions as the buffer layer.

The intermediate layer 12 preferably contains Al. Any group III nitride semiconductor can be used as long as it is denoted by the general formula of AlGaInN. The group III nitride semiconductor may contain As or P as the group III element When the intermediate layer 12 contains Al, the intermediate layer 12 preferably contains GaAlN. When the intermediate layer 12 contains GaAlN, the content of Al is preferably 50% or more. The intermediate layer 12 is more preferably made of AlN, since the intermediate layer 12 can be effectively a columnar crystal aggregation.

The intermediate layer 12 and the base 14*a* are preferably produced by different sputtering film formation devices. Since a chamber for sputtering is strictly designed depending on the kind of material for a film, and different chambers are used to form a layer having a different composition or function.

However, the surface of the intermediate layer 12 is contaminated during carrying between the sputtering devices. Not only being exposed to the atmosphere, but also when there are contaminants in a carrying device or the chambers, a contaminated layer or a damaged layer is generated on the surface 12*a* of the intermediate layer 12 by the contaminants. When the contaminated layer or a damaged layer is partially generated, air spaces (voids) are formed in the base layer 14*a* by the adverse affects of the contaminated layer or the damaged layer, and the crystallinity and crystal density of the base layer 14*a* are decreased.

Moreover, "base layer 14*a* having decreased crystallinity" means a base layer 14*a* of which the entire crystallinity is decreased, and a base layer 14*a* in which the crystallinity of the crystal particles itself contained in the base layer 14*a* is decreased. In addition, "base layer 14*a* having decreased crystal density" means a base layer 14*a* having decreased density by generating gaps or air spaces (voids) between crystal grains constituting the base layer 14*a*. When the crystal density is decreased, the surface of the base layer 14*a*, which faces the n-type contact layer, is rough due to the existence of the gaps or voids between the crystal grains. Thereby, the formation of the n-type contact layer 14*b* is largely subjected to adverse effects. The decrease of the crystallinity and crystal density in the base layer 14*a* causes a decrease of crystallinity of the whole of the n-type contact layer 14*b*, the n-type clad layer 14*c*, the light-emitting layer 15, and the p-type semiconductor layer 16 which are laminated on the base layer 14*a*. That is, this causes the decrease of the crystallinity of the group III nitride semiconductor crystals constituting the light-emitting device. In particular, the roughness of the surface of the base layer 14*a* influences the n-type clad layer 14 which contacts the light-emitting layer 15, and makes the surface of the light-emitting layer rough. Thereby, the light-emitting properties are largely deteriorated.

Therefore, the intermediate layer 12 is subjected to the pretreatment step including a plasma treatment as explained below in the present invention. When the surface 12*a* of the intermediate layer 12 is subjected to the pretreatment step, the contaminated layer or the damaged layer, which is generated on the surface 12*a* of the intermediate layer 12, is removed, or the intermediate layer 12 itself is repaired. In other words, since stress applied to the intermediate layer 12 is released, the intermediate layer 12 changes to a stable crystal layer. As explained above, the base layer 14*a* which is formed on the stable intermediate layer 12 has extremely improved crystallinity and crystal density, and the generation of the voids is prevented.

[Laminate Semiconductor 10]

The laminate semiconductor 10 shown in FIG. 3 includes the n-type semiconductor layer 14, which is made of a nitride-based compound semiconductor and is laminated on the substrate 11 via the intermediate layer 12 explained above, the light-emitting layer 15, and the p-type semiconductor layer 16.

The n-type semiconductor layer 14 contains at least the group III nitride semiconductor. In addition, the n-type semiconductor layer 14 includes the base layer 14*a* which is formed by sputtering. The base layer 14*a* is laminated on the intermediate layer 12.

As shown in FIG. 3, a functional crystal laminate structure such as the laminate semiconductor 10 can be laminated on the base layer 14*a* containing the group III nitride semiconductor. For example, the semiconductor laminate structure for a light-emitting device can be formed by laminating the n-type conducive layer in which the n-type dopant such as Si, Ge, Sn is doped, or the p-type conductive layer in which the p-type dopant such as Mg is doped. Examples of the material for the light-emitting layer and the like include InGaN. Examples of the material for the clad layer and the like include AlGaN.

As explained above, a wafer having the semiconductor laminate structure, which is used for light-emitting diodes, laser diodes, or electronic devices, can be produced by forming the group III nitride semiconductor crystal layer having various functions on the base layer 14*a*. Below, the laminate semiconductor 10 is explained in detail.

As the nitride based semiconductor, for example, many gallium nitride-based compound semiconductors, which are shown by the general formula: $Al_XGa_YIn_ZN_{1-A}M_A$ (wherein $0 \leq X \leq 1$, $0 \leq Y \leq 1$, $0 \leq Z \leq 1$, $X+Y+Z=1$, and the sign M expresses the group V element other than nitrogen (N)), are well known. In the present invention, the gallium nitride-based semiconductors shown by the general formula: $Al_XGa_YIn_ZN_{1-A}M_A$ (wherein $0 \leq X \leq 1$, $0 \leq Y \leq 1$, $0 \leq Z \leq 1$, $X+Y+Z=1$, and the sign M expresses the group V elements other than nitrogen (N), and $0 \leq A \leq 1$), which include well-known gallium nitride-based semiconductors, can be used without any limitations.

The gallium nitride-based semiconductor can contain the group III elements other than Al, Ga, and In. Specifically, the gallium nitride semiconductor can contain at least one of Ge, Si, Mg, Ca, Zn, Be, P, and As, if necessary. Furthermore, the gallium nitride semiconductor may contain not only the elements which are intentionally added but also impurities which are inevitably contained depending on the lamination conditions, or remaining impurities which are contained in a raw material and reactor, and the like.

In order to obtain the gallium nitride-based semiconductors, the base layer may be laminated by sputtering, and the layers other than the base layer may be laminated by any method. The methods for laminating the layers other than the base layer are not limited. Examples of the methods include any methods which can grow nitride semiconductors, such as MOCVD method (metalorganic chemical vapor deposition method), HYPE method (hydride vapor phase epitaxial method), and MBE method (molecular beam epitaxial method). From the viewpoint of controllability of thickness of layers, and productivity, MOCVD method is preferable. In the MOCVD method, hydrogen ($H_2$) or nitrogen ($N_2$) is used as a carrier gas, trimethylgallium (TMG) or triethylgallium (TEG) is used as a source of Ga which is a group III material source, trimethylaluminum (TMA) or triethylaluminum (TEA) is used as a source of Al, trimethylindium (TMI) or triethylindium (TEI) is used as a source of In, ammonia ($NH_3$), hydrazine ($N_2H_4$), etc. are used as a source of N which is the group V material source. In addition, examples of the n-type dopant include monosilane ($SiH_4$) or disilane ($Si_2H_6$) as a source of Si, and organic germanium compounds, such as germane gas ($GeH_4$), tetramethyl germanium (($CH_3)_4Ge$), or tetraethyl germanium (($C_2H_5)_4Ge$) as a germanium raw material.

In the MBE method, germanium element can also be used as a source of the doping. Examples of the p-type dopant include biscyclopentadienyl magnesium ($Cp_2Mg$) and bis-ethylcyclopentadienyl magnesium ($EtCp_2Mg$) as a source of Mg.

<N-Type Semiconductor Layer 14>

In general, the n-type semiconductor layer 14 is laminated on the intermediate layer 12, and includes the base layer 14a, the n-type contact layer 14b, and the n-type clad layer 14c.

The n-type contact layer 14b can be served as the base layer 14a and/or the n-type clad layer 14c. The base layer 14a can also serve as the n-type contact layer 14b and/or the n-type clad layer 14c.

"Base Layer 14a"

The base layer 14a is formed by laminating the group III nitride semiconductor on the intermediate layer 12. The base layer 14a may be formed using the different material from that of the intermediate layer 12 formed on the substrate 11. The base layer is preferably an $Al_xGa_{1-x}N$ layer ($0 \leq x \leq 1$, preferably $0 \leq x \leq 0.5$, and more preferably $0 \leq x \leq 0.1$).

The present inventors found that the group III nitride containing Ga, that is, a GaN-based compound semiconductor is preferable as a material for the base layer 14a. When the intermediate layer 12 is made of AlN, it is necessary to loop the dislocation by migration in the base layer 14a so as not to take over the dislocation of the intermediate layer 12, which is a columnar crystal aggregation. Examples of material which easily produces a dislocation loop include GaN-based compound semiconductors. In particular, AlGaN or GaN is preferable.

The thickness of the base layer 14a is preferably 0.1 μm or more, more preferably 0.5 μm, and most preferably 1 μm or more. When the thickness of the base layer 14a is 0.1 μm or more, the $Al_xGa_{1-x}N$ layer having excellent crystallinity is easily obtained.

The base layer 14a may be doped with an n-type impurity in a range of from $1 \times 10^{17}$ to $1 \times 10^{19}/cm^3$, if necessary. However, the base layer 14a may be undoped ($<1 \times 10^{17}/cm^3$). The undoped base layer 14a is preferable, because it can maintain excellent crystallinity. Any n-type impurities can be used. Examples of the n-type impurities include Si, Ge, and Sn. Si and Ge are preferable.

When a conductive substrate is used as the substrate 11, electrodes can be formed on both sides of a chip of the light-emitting device 1 by doping the base layer 14a such that a current of electricity flows through the thickness direction of the base layer 14.

When an insulating substrate is used as the substrate 11, electrodes are formed on the identical surface of a chip of the light-emitting device 1. Therefore, the base layer 14a, which is laminated on the substrate 11 via the intermediate layer 12, is preferably made of undoped crystals. When the base layer 14a is not undoped, the base layer 14a has excellent crystallinity.

(Method for Forming the Base Layer 14a)

In the light-emitting device 1 in the embodiment, the base layer 14a is formed by depositing the group III nitride semiconductor by sputtering. When sputtering is used, the device needed can be more simple compared with the devices used in the MOCVD method and MEB method.

When the base layer 14a is formed by sputtering, it is preferable that the base layer 14a be formed by reactive sputtering in which the group V raw material flows in a reactor.

As explained above, in general, the higher the purity of the target material is, the more excellent the film properties of the obtained thin film, such as crystallinity. When the base layer 14a is formed by sputtering, sputtering can be carried out by using the group III nitride semiconductor as the target material which is a raw material of the base layer 14a, and plasma generated by inert gas such as Ar. In a reactive sputtering method, it is possible to improve the purity of the group III metal or the mixture containing the group III metal used as the target material compared with the group III nitride semiconductor. Therefore, it is possible to further improve the crystallinity of the obtained base layer 14a in the reactive sputtering method.

The temperature of the substrate 11 when the base layer 14 is formed, that is, the growth temperature of the base layer 14a is preferably 80° C. or more, more preferably 900° C., and most preferably 1,000° C. or more. When the temperature of the substrate 11 during the formation of the base layer 14 is higher, atoms easily migrate, and the dislocation loop is easily developed. It is necessary that the substrate temperature, when the base layer 14a is formed, be less than the decomposition temperature of the crystal. Therefore, the temperature of the substrate 11 is preferably less than 1,200° C. When the temperature of the substrate 11 during the formation of the base layer 14a is in the range, the base layer 14a having excellent crystallinity can be obtained.

"N-Type Contact Layer 14b"

It is preferable that the n-type contact layer 14b be an $Al_xGa_{1-x}N$ layer ($0 \leq x \leq 1$, preferably $0 \leq x \leq 0.5$, and more preferably $0 \leq x \leq 0.1$), similar to the base layer 14a. In addition, the n-type contact layer 14b is preferably doped with the n-type impurities. The concentration of the n-type impurities is preferably in a range of from $1 \times 10^{17}$ to $1 \times 10^{19}/cm^3$, and more preferably in a range of from $1 \times 10^{18}$ to $1 \times 10^{19}/cm^3$. When the n-type impurities are doped in the range, it is possible to maintain excellent ohmic contact to the cathode and crystallinity, and prevent the generation of cracks. Any n-type impurities can be used. Examples of the n-type impurity include Si, Ge, and Sn. Among these, Si and Ge are preferable. The growth temperature of the n-type contact layer 14b is the same temperature as that of the base layer 14a.

The gallium nitride based semiconductors which constitute the base layer 14a and the n-type contact layer 14b have preferably the identical composition. The total thickness of the base layer 14a and the n-type contact layer 14b is preferably in a range of from 1 to 20 μm, more preferably in a range of from 2 to 15 μm, and most preferably in a range of from 3 to 12 μm. When the total thickness of the layers is in the range, excellent crystallinity of the semiconductor can be maintained.

"N-Type Clad Layer 14c"

It is preferable that the n-type clad layer 14c be formed between the n-type contact layer 14b and the below-mentioned light-emitting layer 15. When the n-type clad layer 14c is formed, it is possible to improve flatness of the outermost surface of the n-type contact layer 14b. The n-type clad layer 14c can be formed by AlGaN, GaN, GaInN, etc. The n-type clad layer 14c also has the hetero junction structure of the layers made of AlGaN, GaN, or GaInN, or the superlattice structure in which the layer is laminated two or more times. When the n-type clad layer 14c is made of GaInN, it is needless to say that the band gap of the n-type clad layer 14c is preferably larger than that of the light-emitting layer 15.

The thickness of the n-type clad layer 14c is not limited, but it is preferably in a range of from 5 to 500 nm, and more preferably in a range of from 5 to 100 nm.

The concentration of the n-type dopant in the n-type clad layer 14c is preferably in a range of from $1\times10^{17}$ to $1\times10^{20}/cm^3$, and more preferably in a range of from $1\times10^{18}$ to $1\times10^{19}/cm^3$. When the concentration of the dopant is in the range, it is possible to maintain excellent crystallinity and decrease the operation voltage of the light-emitting device.

<Light-Emitting Layer 15>

The light-emitting layer 15 is laminated on the n-type semiconductor layer 14, and the p-type semiconductor layer 16 is laminated thereon. As shown in FIGS. 1 and 3, the light-emitting layer 15 includes barrier layers 15a made of gallium nitride-based semiconductor, and well layers 15b made of gallium nitride-based semiconductor containing indium in a repeated manner. The barrier layer 15a faces the n-type semiconductor layer 14 and the p-type semiconductor layer 16 respectively.

Specifically, the light-emitting layer 15 in the embodiment shown in FIG. 3 has the structure in which six barrier layers 15a and five well layers 15b are alternately laminated. The barrier layer 15a is positioned at the uppermost and lowermost surface of the light-emitting layer 15. The well layer 15b is positioned between the barrier layers 15a.

As the material for the barrier layer 15a, a gallium nitride-based semiconductor, such as $Al_cGa_{1-c}N$ ($0 \leqq c < 0.3$), which has a larger band gap energy than that of the gallium nitride-based semiconductor containing indium and constituting the well layer 15b, is preferably used. Examples of the gallium nitride-based semiconductor containing indium include $Ga_{1-s}In_sN$ ($0 < s < 0.4$).

The entire thickness of the light-emitting layer 15 is not particularly limited. However, the thickness by which quantum effects can be obtained, that is, the critical thickness, is preferable. Specifically, the thickness of the light-emitting layer 15 is preferably in a range of from 1 to 500 nm, and more preferably around 100 nm. When the thickness of the light-emitting layer 15 is in the range, light-emitting power can be improved.

<P-Type Semiconductor Layer 16>

In general, the p-type semiconductor layer 16 includes the p-type clad layer 16a and the p-type contact layer 16b. However, the p-type contact layer 16a may serve as the p-type clad layer 16b.

"P-Type Clad Layer 16a"

The material for the p-type clad layer 16 may have any composition which has a larger band gap than that of the light-emitting layer 15 and can block the carrier toward the light-emitting layer 15. Examples of the preferable material include $Al_dGa_{1-d}N$ ($0 < d \leqq 0.4$, and preferably $0.1 \leqq d \leqq 0.3$). The p-type clad layer 16a made of AlGaN is preferable, from the viewpoint of blocking of the carriers toward the light-emitting layer 15. The thickness of the p-type clad layer 16a is not limited. However, the thickness of the p-type clad layer 16a is in a range of from 1 to 400 nm, and more preferably in a range of from 5 to 100 nm. The dopant concentration in the p-type clad layer 16a is in a range of from $1\times10^{18}$ to $1\times10^{21}/cm^3$, and more preferably in a range of from $1\times10^{19}$ to $1\times10^{20}/cm^3$. When the dopant concentration in the p-type clad layer 16a is in the range, excellent p-type crystals can be obtained without reducing the crystallinity.

"P-Type Contact Layer 16b"

The p-type contact layer 16b is a gallium nitride-based semiconductor layer containing at least $Al_eGa_{1-e}N$ ($0 \leqq e < 0.5$, preferably $0 \leqq e \leqq 0.2$, and more preferably $0 \leqq e \leqq 0.1$). It is preferable that the Al in the range be contained in the p-type contact layer 16b, because excellent ohmic contact with the p-ohmic electrode (refer to a transparent electrode 17 explained below) is obtained and excellent crystallinity can be maintained.

In addition, the p-type dopant is preferably contained in a range of from $1\times10^{18}$ to $1\times10^{21}/cm^3$, and more preferably in a range of from $5\times10^{19}$ to $5\times10^{20}/cm^3$. When the p-type dopant concentration is in the range, it is possible to maintain excellent ohmic contact and crystallinity, and prevent the generation of cracks. Any p-type impurities can be used. However, Mg is preferably used.

The thickness of the p-type contact layer 16b is not limited. However, the thickness of the p-type contact layer 16b is preferably in a range of from 10 to 500 nm, and more preferably in a range of from 50 to 200 nm. The thickness range of the p-type contact layer 16b is preferably from the viewpoint of light-emitting output power.

[Transparent Anode 17]

The transparent anode 17 is a transparent electrode formed on the p-type semiconductor layer 16 in the laminate semiconductor 10. The transparent anode 17 is made of any materials. Examples of the material include ITO ($In_2O_3$—$SnO_2$), AZO (ZnO—$Al_2O_3$), IZO ($In_2O_3$—ZnO), and GZO (ZnO—$GeO_2$). The transparent anode 17 can be formed by well-known methods in this technical field using the material. In addition, any structures including conventional well-known structures can be used without limitations.

The transparent anode 17 may be formed so as to cover the almost entire surface of the Mg-doped p-type semiconductor layer 16. In addition, the transparent anode 17 may also be formed in a lattice shape or a tree shape so as to have intervals. After forming the transparent anode 17, thermal annealing may be performed on the alloy to make it transparent. However, thermal annealing may not be performed.

[Anode Bonding Pad 18]

The anode bonding pad 18 is an electrode formed on the transparent anode 17. Various materials such as Au, Al, Ni, Cu, etc. are known as a material for the anode bonding pad 18. In addition, various structures for the anode boding pad are also known. Various well-known materials and structures can be used as the anode bonding pad 18 in the present invention without limitations. The thickness of the anode bonding pad 18 is preferably in a range of from 100 to 1,000 nm. The thicker the anode bonding pad 18 is, the higher the bondability is. Therefore, it is preferable that the thickness of the anode bonding pad 18 be 300 nm or more. From the viewpoint of the production cost, it is preferably 500 nm or less.

[Cathode Bonding Pad 19]

The cathode bonding pad 19 is formed so as to contact the n-type contact layer 14b in the n-type semiconductor layer 14 in the semiconductor layer in which the n-type semiconductor layer 14, the light-emitting layer 15, and the p-type semiconductor layer 16 are laminated on the substrate 11 in this order. Therefore, a part of the p-type semiconductor 16, the light-emitting layer, and the n-type semiconductor layer 14 is removed to form an exposed area 14d where the n-type contact layer 14b is formed, and then the cathode bonding pad 19 is formed on the exposed area 14d.

The cathode bonding pad 19 can be formed by a well-known method using any materials and structure in this technical field without limitation.

"A Production Method for the Group III Nitride Semiconductor Light-Emitting device"

Next, the production method for the light-emitting device 1 is explained. The production method for the light-emitting device mainly includes a step (an intermediate layer formation step) in which the intermediate layer 12 is formed on the substrate 11 and a step (a laminate semiconductor formation step) in which the n-type semiconductor layer 14 having a base layer 14a, a light-emitting layer 15, and a p-type semiconductor layer 16 are laminated on the intermediate layer 12 in this order. In addition, the method includes a pretreatment step in which the intermediate layer 12 is treated using plasma between the intermediate layer formation step and the laminate semiconductor formation step. Furthermore, the method including a formation step for the base layer 14a which is included in the laminate semiconductor formation step is a step for laminating the base layer 14a by sputtering.

In the production method for the light-emitting device 1, when the laminate semiconductor 10 is formed by epitaxially growing the group III nitride semiconductor crystals on the substrate 11, the pretreatment step is carried out as a previous step for laminating the base layer 14a made of the group III nitride by sputtering on the intermediate layer 12. In the pretreatment step, the intermediate layer 12 is treated with plasma. When the intermediate layer 12 is treated with plasma, it is possible to effectively grow the laminate semiconductor containing the group II nitride semiconductor having excellent crystallinity without generating voids in the layers.

Below, each step is explained in series.

[Intermediate Layer Formation Step]

In the intermediate layer formation step, first, the substrate 11 is prepared. It is preferable that the substrate 11 be pretreated, such as cleaning, before using. For example, when the substrate is made of silicon, a method can be used in which the surface of the substrate 11 is hydrogen-terminated by a wet method such as the well-known RCA cleaning method. Thereby, the intermediate layer formation step can be carried out stably. In addition, the substrate 11 may be pretreated by putting the substrate 11 in a chamber of the sputtering device, and reversely sputtering the surface 11a of the substrate 11 before forming the intermediate layer 12. Specifically, the pretreatment can be carried out by exposing the substrate 11 to Ar or $N_2$ plasma in the chamber to clean the surface of the substrate 11. When plasma generated using Ar gas or $N_2$ as is applied to the surface 11a of the substrate, organic materials or oxides attached to the surface 11a of the substrate 11 can be removed. In this case, when a voltage is applied between the substrate 11 and the chamber without applying power to the target, plasma particles are effectively applied to the substrate 11.

Then, after the pretreatment of the substrate 11, the intermediate layer 12 is formed on the substrate 11 by sputtering using the group III nitrides. When the intermediate layer 12 made of the group III nitrides is formed by sputtering, a reactive sputtering method is used in which the group III metal is used as a target, and gas containing nitrogen such as $N_2$ as is introduced into a chamber (first chamber) for sputtering, and the group III metal and nitrogen are reacted in a gas phase. The sputtering may be RF sputtering, or DC sputtering. When the reactive sputtering is used, since DC sputtering, which continuously discharges, intensely charges the target, control of the film formation rate is difficult. Therefore, RF sputtering or DC sputtering which periodically gives a bias like a pulse is preferable. When FR sputtering is used, the magnet is preferably moved within the target to prevent charging the target. Specific movement of the magnet varies depending on the device used. The magnet may be fluctuated or rotated.

When the intermediate layer 12 is formed by sputtering, it is preferable to supply reactive species having high energy to the substrate 11. In order to supply reactive species having high energy to the substrate 11, it is preferable that the substrate 11 be located in plasma in the first chamber so as to face the target. The distance between the substrate 11 and the target is preferably in a range of from 10 mm to 100 mm. In addition, it is also preferable that no impurities be in the first chamber. Therefore, the ultimate vacuum in the first chamber is preferably $1.0 \times 10^{-3}$ Pa or less.

It is preferable that the atmosphere in the chamber for sputtering (first chamber) contain nitrogen gas ($N_2$). The nitrogen gas is decomposed to become plasma, and becomes a source of crystal growth. Moreover, nitride source gas, which can be used as an active gas, such as ammonia or nitride can be used without any limitations instead of nitrogen gas in the present invention.

In order to effectively sputter the target, the remaining gas other than nitrogen in the atmosphere gas in the first chamber is a heavy inert gas having low reactivity, such as argon (Ar).

The flow rate of nitrogen to the total of nitrogen and the inert gas is preferably in a range of from 20 to 98%. When the flow rate of nitrogen is less than 20%, sputtered metal is deposited in metal conditions as it is. In contrast, when it exceeds 98%, sputtering speed is decreased. Moreover, the remaining gas other than nitrogen in the atmosphere gas in the first chamber may contain hydrogen gas ($H_2$).

The film formation rate is preferably in a range of from 0.01 nm/s to 10 nm/s. When the film formation rate is less than 0.01 nm/s, the time for the film formation step is long, which is not preferable industrially in terms of production. In contrast, when it exceeds 10 nm/s, the obtained film is not made of crystals and is amorphous, and formation of an excellent film is difficult.

The substrate temperature during formation of the intermediate layer 12 is in a range of from room temperature to 800° C., and preferably in a range of from 300 to 800° C. When the substrate temperature is less than the minimum of the range, the migration on the substrate 11 is prevented and the intermediate layer 12 having excellent crystallinity may not be formed. In contrast, when the substrate temperature exceeds the maximum of the range, crystals in the intermediate layer 12 may be decomposed.

In order to make migration active during crystal growth, the bias power applied to the substrate and the target is preferably larger. Specifically, the bias applied to the substrate during the film formation is preferably 1.5 W/cm² or more. The bias applied to the target during the film formation is preferably in a range of from 1.5 W/cm² to 5 kW/cm². When the power applied to the target is adjusted in the range, reactive species having large power can be formed and the formed reactive species having large power can be supplied to the substrate with high kinetic energy. Thereby, migration on the substrate becomes active.

The pressure in the chamber is preferably 0.3 Pa or more. When it is less than 0.3 Pa, since the amount of nitrogen is too small, the sputtered metal may be attached to the substrate without becoming nitride. Although the maximum pressure in the chamber is not limited, it is necessary to adjust the pressure to a small level such that plasma is generated.

When the intermediate layer 12 made of the group III nitride is formed by sputtering, the composition of the formed group III nitride can be controlled by adjusting the composition of the group III metal which constitutes the target in the first chamber. For example, when the intermediate layer 12 made of AlN is formed, Al metal may be used as the target. When the intermediate layer 12 is made of AlGaN, an AlGa alloy may be used as the target.

Moreover, when the n-type semiconductor layer 14, the light-emitting layer, and the p-type semiconductor layer 16 are sputtered, it is necessary to change the target in each of the layers. Therefore, it is necessary to prepare the sputtering device, which has the chamber containing the target, such that the number of the sputtering corresponds to the number of kinds of layers to be formed. Then, the sputtering device used may be changed for every layer to be formed.

In order to form the laminate semiconductor 10 after formation of the intermediate layer 12, it is necessary to transfer the substrate 11 from the first chamber in which the target made of Al or the AlGa alloy is provided to the other chamber in which a target made of group III metal other than that in the first chamber is provided. In order to transfer the substrate 11, it is necessary to take out the substrate 11 from the first chamber. When the substrate is taken our from the first chamber, the substrate may be exposed to the atmosphere, or the substrate is transferred to the mobile container filled with inert gas so as not to contact with the atmosphere. However, since the pretreatment is carried out in this embodiment, it is possible to expose the substrate 11 in the atmosphere.

[Pretreatment Step]

Next, plasma treatment is carried out on the surface of the intermediate layer 12 in the pretreatment step. It is preferable that the plasma treatment be a treatment in which the surface of the intermediate layer 12 is exposed to plasma containing gas which generates active plasma species, such as nitrogen, and argon. In particular, the surface of the intermediate layer is preferably exposed with plasma containing nitrogen gas. In addition, the plasma treatment in the pretreatment step is preferably reverse sputtering in this embodiment.

In the pretreatment step in this embodiment, plasma particles effectively work on the intermediate layer 12 by applying voltage between the substrate 11 and the chamber.

The pretreatment gas for plasma treatment of the intermediate layer 12 may be gas containing one component or a mixed gas containing several gases.

Specifically, a pretreatment gas, which contains at least one of nitrogen, argon, and a mixture gas containing nitrogen and argon, is preferably used. The pretreatment gas containing nitrogen is more preferable. In particular, the partial pressure of the raw material gas in the pretreatment gas, such as nitrogen, is preferably in a range of from $1 \times 10^{-2}$ to 10 Pa, and more preferably in a range of from 0.1 to 5 Pa. When the partial pressure of the raw material gas is too high, the energy of the plasma particles is too small, and effects obtained by the pretreatment are decreased. In contrast, when it is too low, the energy of the plasma particles is too large, and the plasma particles may damage the intermediate layer 12.

The time in the plasma pretreatment is preferably in a range of from 30 to 7,200 seconds (2 hours), and more preferably in a range of from 30 to 3,600 seconds (1 hour). When the pretreatment time is shorter than the range, it is needless to say that the effects due to the plasma treatment are not obtained. In addition, particular effects cannot be obtained. There is a possibility of reducing an operating ratio. The time for performing the plasma pretreatment is more preferably in a range of from 60 (1 minute) to 1,800 seconds (30 minutes).

The temperature in the plasma pretreatment is preferably in a range of from 25 to 1,000° C. When the pretreatment temperature is too low, sufficient effects of the pretreatment can not be obtained. In contrast, when it is too high, the surface of the substrate 11 may be damaged. The temperature in the plasma pretreatment is more preferably in a range of from 400° C. to 900° C.

The chamber (the second chamber) used in the plasma treatment in the pretreatment step may be the same chamber as used the lamination of the base layer 14a in the following sputtering step, or the other chamber. It is preferable that the chamber used in the pretreatment step and the sputtering step be identical, from the viewpoint of decrease of cost of production. When reverse sputtering is carried out as a plasma treatment under the same conditions as those in lamination of the base layer 14a, since the time to change the sputtering conditions is not needed, the availability ratio is improved.

In the pretreatment step, the ultimate pressure in the second chamber before introducing the pretreatment gas is preferably $1.0 \times 10^{-4}$ Pa or less. Thereby, it is possible to adjust the partial pressure of the remaining oxygen in the second chamber to $5.0 \times 10^{-5}$ Pa, and preferably $2.0 \times 10^{-6}$ Pa or less. Due to this, generation of oxides on the upper surface of the intermediate layer 12 can be prevented.

In the pretreatment step in this embodiment, it is preferable that the plasma used in the plasma pretreatment be generated by RF discharge. When plasma is generated by RF discharge, it is possible to subject the insulating substrate to plasma treatment. It is also preferable that a bias in a range of from 1 to 200 W per the substrate having a diameter of 50 mm be applied, and more preferably in a range of from 10 W to 100 W. Thereby, the pretreatment can be effectively carried out on the intermediate layer 12. Moreover, the pretreatment of the intermediate layer 12 may be carried out together with the wet method.

In this embodiment, after the plasma treatment for the intermediate layer 12 in the pretreatment step, the base layer 14a made of the group III nitride is laminated in the following sputtering step, and the n-type semiconductor layer 14 having the base layer 14a on the intermediate layer 12 is formed. Thereby, the generation of voids in the base layer 14a, which are generated by the damage of the surface of the intermediate layer 12, is prevented. Due to this, the crystallinity of the group III nitride semiconductor is improved, and light-emitting properties of the light-emitting device can also be improved.

The mechanism for obtaining the effects by the plasma treatment of the intermediate layer 12 is unclear. However, one assumption is exemplified, in which the contamination, the altered layer, or the damaged layer, which is generated on the surface of the intermediate layer 12 by being exposed to the atmosphere, is removed by the plasma treatment, such as reverse sputtering, and the surface of the intermediate layer 12, which has original properties, is exposed.

[Laminate Semiconductor Formation Step]

In a laminate semiconductor formation step, the n-type semiconductor layer 14 having the base layer 14a, the light-emitting layer 15, and the p-type semiconductor layer 16 are laminated in series. In order to form the n-type semiconductor layer 14, the light-emitting layer 15, and the p-type semiconductor layer 16, various methods such as the sputtering method, MOCVD method, and MBE method can be used. However, when the base layer 14a in the n-type semiconductor layer 14 is formed, the sputtering method is used. Below, the formation step for the base layer 14a is explained.

<The Formation Step of the Base Layer 14a>

In the formation step of the base layer 14a, the base layer 14a is formed on the intermediate layer 12 by sputtering. Specifically, the base layer 14a is formed by activating a metal raw material and a gas containing the group V element with plasma, and reacting them.

In sputtering, a technique for improving efficiency by blocking plasma in a magnetic field to increase the plasma density is generally used. It is possible to uniformly sputter within a surface of the target by moving the position of a magnet. Specific movement of the magnet can be adjusted depending on the sputtering device. For example, the magnet may be fluctuated or rotated.

Figure 5:
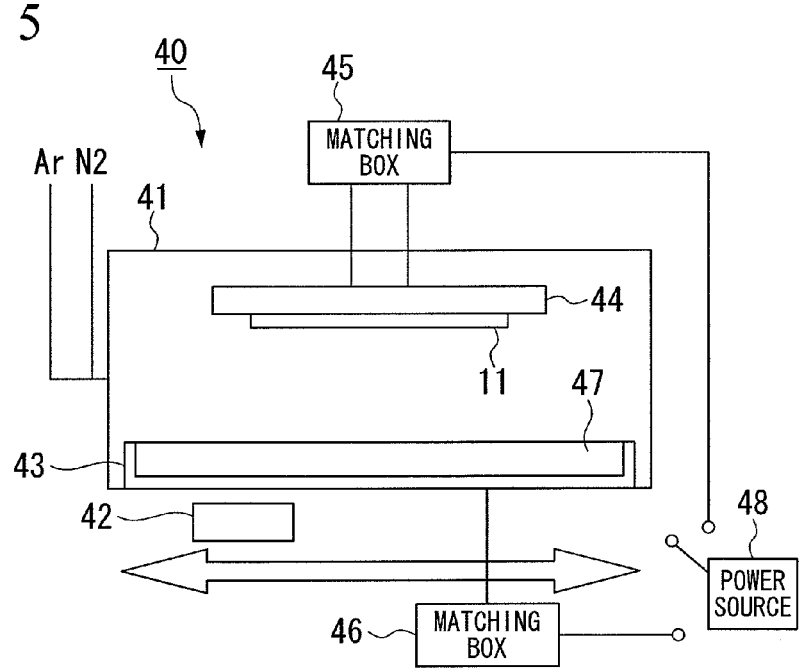
FIG. 5 is a schematic view showing the sputtering device used in the production method of the group III nitride semiconductor light-emitting device according to the present invention.

In the RF sputter device 40 shown in FIG. 5, the magnet 42 is arranged under the metal target 47. The magnet 42 comes and goes under the metal target 47 due to the drive unit, which is not shown in FIG. 5. Nitrogen gas and argon gas are introduced into the chamber 41. The base layer 14*a* is formed on the intermediate layer 12 formed on the substrate 11 attached to the heater 44.

Examples of important parameters in the case of forming the base layer 14*a* by sputtering include the substrate temperature, the pressure in the chamber, and the partial pressure of nitrogen.

The pressure in the chamber when the base layer 14*a* is formed by sputtering is preferably 0.3 Pa or more. When the pressure in the chamber is less than 0.3 Pa, the abundance of nitrogen is small and there is a possibility that the sputtered metal may be attached on the substrate 11 without becoming nitride. Although the maximum pressure in the chamber is not limited, it is required to adjust the pressure so as to generate plasma.

The flow ratio of nitrogen relative to the total of nitrogen ($N_2$) and Ar is preferably in a range of from 20% to 80%. When the flow rate of nitrogen is less than 20%, there is a possibility that the sputtered metal may be attached on the substrate 11 just as metal without becoming nitride. In contrast, when it exceeds 80%, the relative amount of Ar is small, and the sputtering rate is decreased. The flow ratio of nitrogen relative to the total of nitrogen ($N_2$) and Ar is more preferably in a range of from 50% to 80%.

The film formation rate of the base layer 14*a* is preferably in a range of from 0.01 nm/s to 10 nm/s. When the film formation rate is less than 0.01 nm/s, the base layer 14*a* grows to have an island shape, without being a layer, and there is a possibility that the base layer 14*a* cannot cover the surface of the intermediate layer 12. In contrast, when it exceeds 10 nm/s, a film may be amorphous, without becoming crystal.

When the base layer 14*a* is formed by sputtering, it is preferable to use reactive sputtering in which the material containing a group V element is flowed through the reactor.

In general, the higher the purity of the target is, the more excellent the film properties such as crystallinity of the obtained film are in sputtering. When the base layer 14*a* is formed by sputtering, it is also possible to use the group III nitride semiconductor as the target material, and plasma of an inert gas such as Ar gas. In particular, the purity of the group III metal or the mixture thereof can be improved compared with the group III nitride semiconductor. Therefore, it is possible to further improve the crystallinity of the obtained base layer 14*a* by reactive sputtering.

The temperature of the substrate 11 during formation of the base layer 14*a* is preferably in a range of from 300 to 800° C., and more preferably in a range of from 400 to 800° C. When the temperature of the substrate 11 is less than the minimum temperature of the range, the base layer 14*a* cannot cover the entire surface of the intermediate layer 12, and there is a possibility that the surface of the intermediate layer 12 may be exposed.

When the intermediate layer 12 containing mixed crystal is laminated by making the metal raw material be plasma by sputtering, a method may be used in which a mixture of the target metals (the metals may not be an alloy) is prepared in advance. In addition, a method in which two targets, which are different materials, are sputtered at the same time, may also be used. When the film having a fixed composition is formed, the target which is a mixture of metals may be also used. When several films having different compositions are formed, several targets may be arranged in the chambers.

The nitrogen raw materials which are generally known can be used as a nitrogen material in the embodiment without any limitations. However, ammonia and nitrogen ($N_2$) are preferable, because they are easily obtained at comparatively low price, and are easy to handle. Ammonia has improved decomposition efficiency, and can form the base layer 14*a* with a high growth rate. However, ammonia has high reactivity and toxicity. Therefore, it is necessary to provide toxic material elimination equipment or a gas detector. It is also necessary to make the reaction apparatus with materials which have high chemical stability.

When nitrogen ($N_2$) is used as a raw material, a simple apparatus can be used. However, a high reaction rate is not obtained. However, when nitrogen is introduced into the apparatus after decomposition by electrical field or heat, a film formation rate which is lower than that of ammonia but sufficient in industrial production can be achieved. Therefore, when the cost of the apparatus and the industrial production are concerned, nitrogen is the most preferably used as a nitrogen source.

The base layer 14*a* may be formed on the entire surface of the substrate 11 without movement of the substrate 11 by a method in which an area of the generation source of the film material is large, and the position of the generation source is moved. Examples of the method include the RF sputtering in which a film is formed by swinging or rotating the magnet to change the position of the cathode magnet within the target, as explained above. When the base layer is formed by the RF sputtering, both of the substrate and the cathode may be moved. In addition, a film can be formed simultaneously on both of the main surfaces and side surfaces of the substrate by arranging the cathode, which is the generation source of the material, near the substrate and supplying plasma so as to cover the substrate, not being linearly supplied.

Examples of a method for generating plasma include a sputtering method, in which plasma is generated by applying a high voltage to discharge in a fixed degree of vacuum used in this embodiment; a pulse laser deposition method (PLD method), in which plasma is generated by irradiating a laser having a high energy density; a pulsed electron beam deposition method (PED method) in which plasma is generated by irradiating an electron beam. Among these, the sputtering method is simple and suitable for commercial production. Therefore, the sputtering method is preferable. Moreover, when DC sputtering is used, there is a possibility that the surface of the target is charged up, and the film formation rate varies. Therefore, pulse DC sputtering or RF sputtering is preferable.

<Other Steps>

After the base layer 14*a* is formed, the n-type contact layer 14*b* and the n-type clad layer 14*c* are laminated to form the n-type semiconductor layer 14. The n-type contact layer 14*b* and the n-type clad layer 14*c* may be formed by sputtering or the MOCVD method.

The upper surface of the n-type clad layer 14*c* has a relatively small roughness by laminating the base layer 14*a* to the n-type clad layer 14*c* in series on the intermediate layer 12 after the plasma treatment. Thereby, it is possible to epitaxially grow the light-emitting layer 15 with stability, and form the light-emitting layer 15 having excellent light-emitting properties.

The light-emitting layer 15 can be formed by the sputtering method, or MOCVD method. However, the MOCVD method is preferable. Specifically, the light-emitting layer 15 can be obtained by laminating repeatedly the barrier layer 15a made of a gallium nitride-based semiconductor and the well layer 15b made of a gallium nitride-based semiconductor containing indium by turns such that the barrier layer 15a contacts the n-type semiconductor layer 14 and the p-type semiconductor layer 16.

The p-type semiconductor layer 16 may be formed by the sputtering method or MOCVD method. Specifically, the p-type semiconductor layer 16 is formed by laminating the p-type clad layer 16a and the p-type contact layer 16b in this order.

Then, the transparent anode 17 is laminated on the cathode bonding pad 19. After that, a part of the n-type contact layer 14b is exposed by etching a part of the laminate semiconductor 10, forming the cathode bonding pad 19 on the exposed n-type contact layer 14b, and forming the anode bonding pad 18 on the transparent anode 17. Thereby, the light-emitting device 1 shown in FIGS. 1 and 2 is produced.

As explained above, according to the production method for the group III nitride semiconductor light-emitting device 1, the method includes the pretreatment step in which the intermediate layer 12 laminated on the substrate 11 is treated using plasma, and the lamination step in which the base layer 14a is laminated on the intermediate layer 12 by sputtering after the pretreatment step. Due to this, the base layer 14a has a crystal structure with high uniformity and density on the surface of the substrate 11. Therefore, it is possible to efficiently grow the group III nitride semiconductor having excellent crystallinity of the substrate 11. As a result, it is also possible to produce the group III nitride semiconductor light-emitting device 1 having excellent light-emitting properties with high productivity.

As explained above, the mechanism for obtaining the effects by the plasma treatment to the intermediate layer 12 is unclear. However, one assumption is exemplified, in which the contamination attached on the surface of the intermediate layer 12 is exposed and chemically reacted with plasma and removed. Thereby, the boundary surface between the intermediate layer 12 and the base layer 14a is cleaned. Due to this, the area at which crystal does not grow is removed.

The intermediate layer and the base layer, which are explained in this embodiment, are not only used in a group III nitride semiconductor light-emitting device. For example, when films are made using materials having the same degree of lattice constants and the material gas and the substrate may be reacted in high temperatures, the intermediate layer and the base layer can be used without any limitations.

"Lamp"

As explained above, a lamp can be produced by well-known means in this technical field using the group III nitride semiconductor light-emitting device 1 according to the present invention and a phosphor. Various techniques for changing emission color by combining the light-emitting device 1 and fluorescence substance have been known. These techniques can be used without any limitations.

For example, it is possible to produce light having wavelength which is larger than that of the light-emitting device by adequately selecting the fluorescence substance. In addition, a lamp producing white light can be produced by mixing the emission wavelength of the light-emitting device and the wavelength which is changed by the fluorescence substance.

The produced lamp can be used as the artillery shell type lamp which is commonly used, the side view type lamp which is used as the back light for portable phones, the top view type lamp which is used for displays, and the like.

For example, when the group III nitride semiconductor light-emitting device 1 having electrodes on the same side thereof is mounted in the artillery shell type lamp, as shown in FIG. 4, one (frame 21 in FIG. 4) of two frames is joined to the light-emitting device 1; the cathode (refer to numerals 19 shown in FIG. 3) of the light-emitting device 1 is joined to the frame 22 with the wire 24; and the anode bonding pad (refer to numerals 18 shown in FIG. 3) is joined to the frame 21 with the wire 23. Then, the area around the light-emitting device 1 is covered with the mold 25 made of a transparent resin. Thereby, the artillery shell type lamp 2 shown in FIG. 4 can be produced.

The group III nitride semiconductor according to the present invention can be used for photoelectricity transformation devices such as laser devices, and light-receiving devices; and electronic devices such as HBTs and HEMTs, in addition to the light-emitting devices.

EXAMPLE

Next, the production methods for a group III nitride semiconductor light-emitting device, and the group III nitride semiconductor light-emitting device are explained in detail referring to Examples. However, the present invention is not limited only to the following Examples.

Example 1

In Example 1, the laminate shown in FIG. 3 was produced. The surface of the base layer 14a was observed. X-ray rocking curve of the base layer 14a was measured. The sectional TEM photograph of the base layer 14a and the intermediate layer 12 were taken. These are explained in detail below.

In this example, the aggregates of the columnar crystals made of AlN as the intermediate layer 12 were produced on the c-plane of the substrate made of sapphire by RF sputtering. A layer made of GaN was formed as the base layer 14a on the intermediate layer 12 by sputtering similarly.

First, a substrate 11, which is made of sapphire and has one mirror-polished surface sufficient to epitaxially grow, was introduced into a sputtering device (first chamber) without pretreatments such as a wet treatment. A device, which has an electrical current source having a high frequency and in which a magnet can be moved within a target, was used as the sputtering device.

Then, the substrate 11 was heated to 500° C. in the sputtering device. After introducing only nitrogen gas with a flow rate of 30 sccm, the pressure inside the chamber was maintained to 1.0 Pa. A bias having high frequency of 50 W was applied to the side of the substrate 11 to expose the substrate 11 to nitrogen plasma (reverse sputtering). During these processes, the temperature of the substrate 11 was 500° C. and the treatment time was 200 seconds.

Subsequently, while the temperature of the substrate 11 was maintained at 500° C., argon gas and nitrogen gas were introduced into the sputter device. After that, high frequency power of 2,000 W was applied to the side of a metal Al target, and the pressure inside the chamber was maintained at 0.5 Pa. Then, the intermediate layer 12 made of AlN was laminated on the substrate 11 made of sapphire by flowing Ar gas and nitrogen gas through the chamber under conditions in which the flow rate thereof was 5 sccm and 15 sccm respectively (the ratio of nitrogen relative to the whole gas was 75%). The growth rate was 0.12 nm/s.

The magnet within the target was fluctuated during the reverse sputtering of the substrate 11 and lamination of the intermediate layer 12.

After the lamination of the AlN (the intermediate layer 12) having 50 nm in thickness, the plasma operation was stopped, and the temperature of the substrate 11 dropped.

Then, the substrate 11 on which the intermediate layer 12 was formed was taken out from the sputtering device (the first chamber), and this was put into the other sputtering device (the second chamber).

First, a substrate 11 having the intermediate layer 12 was put into the sputtering device without pretreatments such as a wet treatment. A device, which has an electrical current source having a high frequency and in which a magnet can be moved within a target, was used as the sputtering device.

The inside of the sputtering device (the second chamber) was decompressed until the final vacuum reached $1.5 \times 10^{-5}$ Pa. Then, the substrate 11 was heated to 700° C. After introducing only nitrogen gas with a flow rate of 42 sccm, the pressure inside the chamber was maintained at 0.2 Pa. While maintaining the conditions, a bias having high frequency of 50 W was applied to the side of the substrate 11 to expose the substrate 11, of which the temperature was maintained to 700° C., with plasma (reverse sputtering). The treatment time was 300 seconds (five minutes).

Subsequently, the temperature of the substrate 11 was raised to 800° C., and argon gas and nitrogen gas were introduced into the sputter device. After that, high frequency power of 2,000 W was applied to the side of a Ga target in a liquid state, and the pressure inside the chamber was maintained to 0.5 Pa. Then, the base layer 14a made of GaN was formed on the intermediate layer 12 made of AlN by flowing Ar gas and nitrogen gas through the chamber under conditions in which the flow rate thereof was 15 sccm respectively (the ratio of nitrogen relative to the whole gas was 50%). The growth rate was about 1 nm/s.

The magnet within the target was fluctuated during the reverse sputtering of the intermediate layer 12 and lamination of the base layer 14a.

After the lamination of the GaN (the base layer 14a) having 4 nm in thickness, the plasma operation was stopped, and the temperature of the substrate 11 dropped.

By these steps, the intermediate layer 12 made of AlN having a columnar structure was formed on the substrate 11 made of sapphire, and the base layer 14a made of undoped GaN-based semiconductor having a thickness of 4 μm was formed, and thereby the sample of Example 1 was produced.

The produced substrate was clear and colorless like a mirror. When the surface of the sample was observed by an optical microscope, pits or the like were not produced at the surface of the base layer 14a.

After that, the X-ray rocking curve (XRC) of the undoped GaN layer (the base layer) obtained by these steps was measured using a 4 crystal X-ray measuring device (PANalytical; Model Number: X' part). The measurement was carried out at the (0002) plane, which is a symmetrical plane, and the (10-10) plane, which is an unsymmetrical plane, using a Cu-β ray-X ray generation source as the light source. In general, the XRC spectral half bandwidth of the (0002) plane is an index of the surface smoothness (mosaicity) of a crystal, and the XRC spectral half bandwidth of the (10-10) plane is an index of the dislocation density (twist) in the group III nitride semiconductor. In the measurements, the undoped GaN layer produced in this Example had the half bandwidth of 50 seconds in the measurement of the (0002) plane and 270 seconds in the measurement of the (10-10) plane.

Figure 6:
FIG. 6 is a sectional TEM photograph of the sample produced in Example 1.

The sectional TEM photograph is shown in FIG. 6, which is near the interface between the thin films of about 0.8 μm in thickness which were produced under the same conditions as those in preparing the intermediate layer 12 and the base layer 14a. There was no damage near the interface, and no air spaces (voids) in the base layer. It was confirmed that dense crystal layers were formed.

Figure 7:
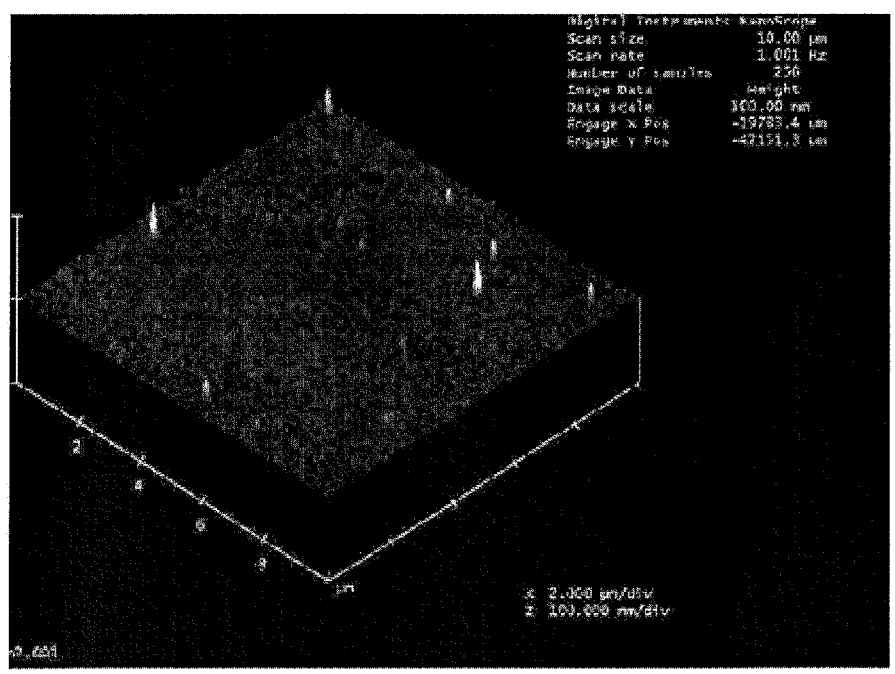
FIG. 7 is an AFM photograph of the surface of the base layer of the sample produced in Example 1.

In addition, the results of scanning the upper surface of the base layer 14 with AFM (Atomic Force Microscopy) are shown in FIG. 7. As shown in FIG. 7, the upper surface of the base layer 14a was quite flat. Average surface roughness (Ra) was 1.5 nm.

Example 2

In this Example, the n-type contact layer 14b which was doped with Si was laminated on the undoped GaN crystals (base layer 14a) having 6 μm in thickness which was similarly produced as in Example 1. In addition, the epitaxial wafer (laminate semiconductor 10) having the epitaxial layer structure for the group III nitride semiconductor light-emitting device shown in FIG. 3 was finally produced by laminating semiconductor layers.

Specifically, the obtained epitaxial wafer was obtained by the following processes. The intermediate layer 12 made of columnar AlN is laminated on the sapphire substrate 11 having the c-plane, similar to Example 1. Then, the base layer 14a, which is made of undoped GaN and has a thickness of 6 μm; the n-type contact layer 14b, which is made of Si-doped GaN having the electron density of $1 \times 10^{19}$ cm$^{-3}$ and has a thickness of 2 μm, the $In_{0.1}Ga_{0.9}$ N-type cladding layer (n-type clad layer 14c), which has the electron density of $1 \times 10^{18}$ cm$^{-3}$, and a thickness of 20 μm; the light-emitting layer 15 (multiple quantum well structure); and the p-type semiconductor layer 16 were laminated on the substrate 11 in this order. The light-emitting layer 15 included six barrier layers 15a, which are made of GaN, and have a thickness of 16 nm; and five well layers 15b, which are made of undoped $In_{0.2}Ga_{0.8}N$, and have a thickness of 3 nm. In the light-emitting layer 15, the barrier layer 15a and the well layer were laminated alternately. The p-type semiconductor layer 16 included the p-type clad layer 16a, which is made of Mg-doped $Al_{0.1}Ga_{0.9}N$ and has a thickness of 5 nm; and the p-type contact layer 16b, which is made of Mg-doped $Al_{0.02}Ga_{0.98}N$ and has a thickness of 200 nm.

In the processes of the epitaxial layers in the semiconductor light-emitting device, the processes from making the intermediate layer 12 made of columnar AlN on the substrate 11 made of sapphire, to making the base layer 14a made of GaN were the same processes as in Example 1. The lamination processes after that were carried out using a common MOCVD device.

As explained above, the epitaxial wafer having an epitaxial layer structure for a semiconductor light-emitting device was produced. Moreover, the p-type contact layer 16b, which is made of Mg-doped $Al_{0.02}Ga_{0.98}N$, showed the p-type properties without annealing to activate the p-type carriers.

Subsequently, the light-emitting diode (see the light-emitting device 1 in FIGS. 1 and 2), which is one type of a semiconductor light-emitting device, was produced using the epitaxial wafer (refer to the laminate semiconductor 10 of FIG. 3) in which the epitaxial layers were laminated on the sapphire substrate 11.

Specifically, the transparent anode 17 made of ITO was formed by a well-known photolithography technique on the surface of the p-type contact layer 16*b*, which is made of Mg-doped $Al_{0.02}Ga_{0.98}N$. Then the anode bonding pad 18 having the structure in which titanium, aluminum, and gold are laminated in this order, was formed on the surface of the obtained transparent anode 17. In addition, a part of the wafer was dry-etched to form the exposed area 14*d* in the n-type contact layer 14. Then, the cathode 19, which includes layers made of Ni, Al, Ti, Au respectively, was also formed on the exposed area 14*d*. Thereby, electrodes shown in FIGS. 1 and 2 were produced on the wafer.

The back surface of the substrate of the wafer which includes electrodes on both the p-type semiconductor layer and the n-type semiconductor layer, was ground and polished to make the surface like a mirror. Then, the wafer was cut into square chips in a size of 350 μm×350 μm. After that, the obtained chip was arranged on the lead frame such that both electrodes face upwardly, connecting to lead frames using metal wires to produce the semiconductor light-emitting device. When a forward current was flowed through the anode bonding pad 18 and the cathode 19 of the obtained device, the forward voltage at 20 mA of current was 3.0 V. When the light-emitting conditions were measured through the transparent anode 17, a light-emitting wavelength was 470 nm and the light-emitting output power was 15 mW. The light-emitting properties were obtained in nearly all the light-emitting diodes having the chip formed by the wafer.

Comparative Example 1

In this Comparative Example, the comparative semiconductor light-emitting device was produced in a manner identical to that of Example 2, except that the base layer 14*a* made of GaN was formed by sputtering without the pretreatment using reverse sputtering after forming the intermediate layer made of AlN on the c-plane of the sapphire substrate.

When the wafer produced in Comparative Example 1 was observed with the optical microscope, minute pits on the surface were observed. In the semiconductor light-emitting device in Comparative Example 1, the forward voltage in 20 mA of current was 2.5 V, and the light-emitting wavelength was 470 nm. However, the light-emitting output power was 1 mW, and was much lower than that of Example 2. It was believed that this was caused due to fine pits on the surface of the wafer.

In addition, when the X-ray rocking curve (XRC) of the base layer 14*a*, which is made of GaN grown by the method in Comparative Example 1, was measured, the half bandwidth at the (0002) plane and the (10-10) plane was 300 seconds and 700 seconds, respectively. From the results, it is clear that the crystallinity of the wafer in Comparative Example 1 was inferior.

Figure 8:
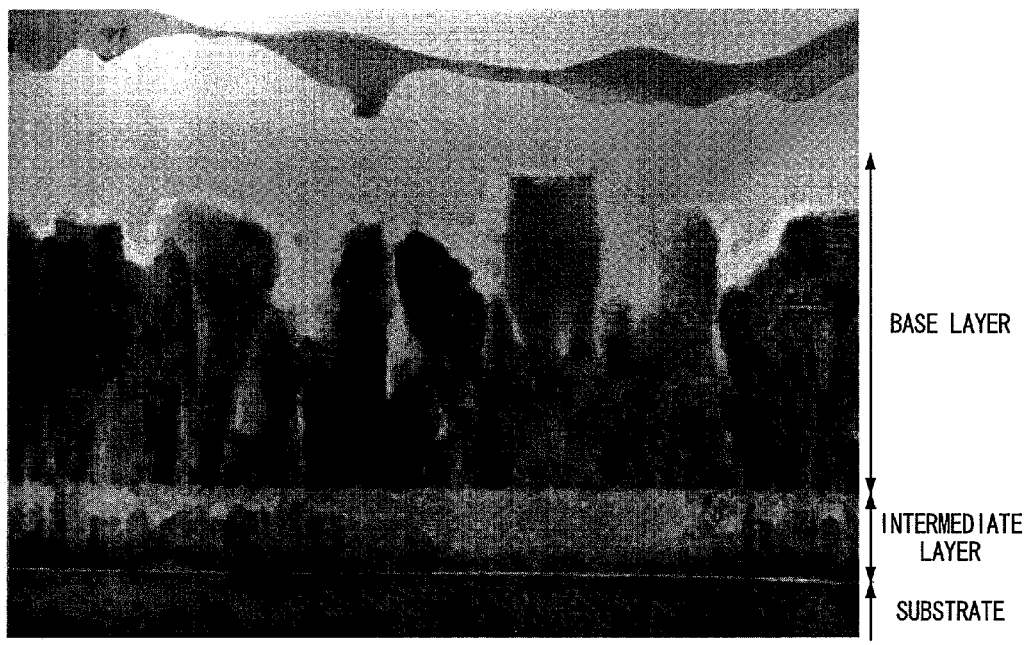
FIG. 8 is a sectional TEM photograph of the sample produced in Comparative Example 1.

The sectional TEM photograph is shown in FIG. 8, which is near the interface between of the thin films of about 0.8 μm in thickness, which was produced under the same conditions as those in preparing the intermediate layer and the base layer in Comparative Example 1. There was a damaged layer near the interface. Due to this, a dense crystal layer could not be formed.

Figure 9:
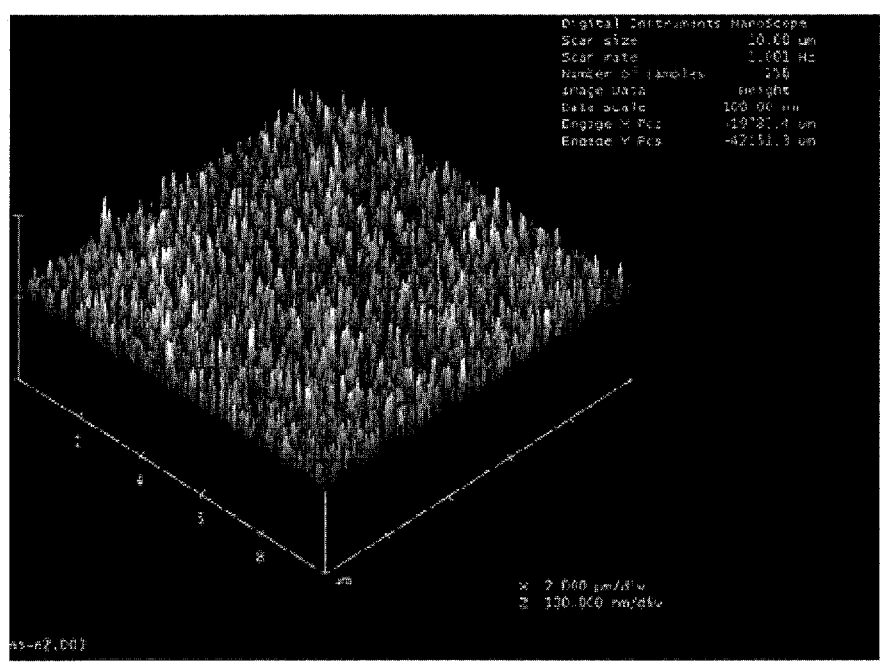
FIG. 9 is an AFM photograph of the surface of the base layer of the sample produced in Comparative Example 1.

In addition, the results of scanning the upper surface of the base layer in Comparative Example 1 with AFM (Atomic Force Microscopy) are shown in FIG. 9. As shown in FIG. 9, it is immediately obvious that the upper surface of the base layer was rough. Furthermore, the average surface roughness (Ra) was 11.0 nm. This is 7.3 times the average surface roughness (Ra) of the base layer in Example 1.
Industrial Applicability According to the method for producing a group III nitride semiconductor light-emitting device and the group III nitride semiconductor light-emitting device of present invention, it is possible to grow a group III nitride semiconductor having excellent crystallinity and density of the crystal on the base layer. Therefore, it is possible to produce a group III nitride semiconductor light-emitting device having excellent light-emitting properties with high productivity.

The invention claimed is:

1. A method for producing a group III nitride semiconductor light-emitting device comprising: an intermediate layer formation step in which an intermediate layer containing group III nitride is formed on a substrate by sputtering, and a laminate semiconductor formation step in which an n-type semiconductor layer having a base layer, a light-emitting layer, and a p-type semiconductor layer are laminated on the intermediate layer in this order,
   wherein the method includes a pretreatment step in which the intermediate layer is treated using plasma between the intermediate layer formation step and the laminate semiconductor formation step, and a formation step for the base layer which is included in the laminate semiconductor formation step is a step for laminating the base layer by sputtering, and
   wherein the intermediate layer formation step is carried out in a first chamber, the formation step for the base layer is carried out in a second chamber, and the substrate on which the intermediate layer is formed is taken out from the first chamber between the intermediate layer formation step and the pretreatment step.

2. The method for producing a group III nitride semiconductor light-emitting device according to claim 1, wherein the pretreatment step is carried out by flowing a pretreatment gas containing at least one selected from the group consisting of nitrogen, argon, and a mixture gas of nitrogen and argon on the surface of the intermediate layer.

3. The method for producing a group III nitride semiconductor light-emitting device according to claim 1, wherein the pretreatment step is carried out by flowing a pretreatment gas containing nitrogen on the surface of the intermediate layer.

4. The method for producing a group III nitride semiconductor light-emitting device according to claim 2, wherein the partial pressure of nitrogen in the pretreatment gas is in a range of from $1\times10^{-2}$ Pa to 10 Pa.

5. The method for producing a group III nitride semiconductor light-emitting device according to claim 2, wherein the pressure of the pretreatment gas during the pretreatment step is in a range of from 0.01 Pa to 5 Pa.

6. The method for producing a group III nitride semiconductor light-emitting device according to claim 1, wherein the partial pressure of oxygen remaining in the second chamber is $2.0\times10^{-6}$ Pa or less.

7. The method for producing a group III nitride semiconductor light-emitting device according to claim 2, wherein the time for the pretreatment is in a range of from 30 seconds to 7,200 seconds.

8. The method for producing a group III nitride semiconductor light-emitting device according to claim 2, wherein the time for the pretreatment is in a range of from 60 seconds to 1,800 seconds.

9. The method for producing a group III nitride semiconductor light-emitting device according to claim 2, wherein the temperature of the substrate in the pretreatment step is in a range of from 25° C to 1,000° C.

10. The method for producing a group III nitride semiconductor light-emitting device according to claim 2, wherein the temperature of the substrate in the pretreatment step is in a range of from 400° C to 900° C.

11. The method for producing a group III nitride semiconductor light-emitting device according to claim 1, wherein the plasma treatment in the pretreatment step is reverse sputtering.

12. The method for producing a group III nitride semiconductor light-emitting device according to claim 11, wherein the pretreatment step is a step in which reverse sputtering is carried out by generating plasma using an electrical power supply having high frequency.

13. The method for producing a group III nitride semiconductor light-emitting device according to claim 11, wherein the pretreatment step is a step in which reverse sputtering is carried out by generating nitrogen plasma using an electrical power supply having high frequency.

14. The method for producing a group III nitride semiconductor light-emitting device according to claim 11, wherein a bias in a range of from 1 to 200 W is applied to one substrate having a diameter of 50 mm in the pretreatment step.

15. The method for producing a group III nitride semiconductor light-emitting device according to claim 1, wherein the intermediate layer includes columnar crystals.

16. The method for producing a group III nitride semiconductor light-emitting device according to claim 1, wherein the intermediate layer is formed so as to cover at least 90% of the surface of the substrate.

17. The method for producing a group III nitride semiconductor light-emitting device according to claim 15, wherein an average grain width of the columnar crystals in the intermediate layer is in a range of from 1 nm to 100 nm.

18. The method for producing a group III nitride semiconductor light-emitting device according to claim 15, wherein an average grain width of the columnar crystals in the intermediate layer is in a range of from 1 nm to 70 nm.

19. The method for producing a group III nitride semiconductor light-emitting device according to claim 1, wherein the thickness of the intermediate layer is in a range of from 10 nm to 500 nm.

20. The method for producing a group III nitride semiconductor light-emitting device according to claim 1, wherein the thickness of the intermediate layer is in a range of from 20 nm to 100 nm.

21. The method for producing a group III nitride semiconductor light-emitting device according to claim 1, wherein the intermediate layer contains Al.

22. The method for producing a group III nitride semiconductor light-emitting device according to claim 21, wherein the intermediate layer is made of AlN.

23. The method for producing a group III nitride semiconductor light-emitting device according to claim 1, wherein the base layer is made of GaN-based semiconductor.

24. The method for producing a group III nitride semiconductor light-emitting device according to claim 23, wherein the base layer is made of AlGaN.

\* \* \* \* \*